United States Patent [19]
Salimian et al.

[11] Patent Number: 5,716,485
[45] Date of Patent: Feb. 10, 1998

[54] ELECTRODE DESIGNS FOR CONTROLLING UNIFORMITY PROFILES IN PLASMA PROCESSING REACTORS

[75] Inventors: Siamak Salimian, Sunnyvale; Carol M. Heller, San Jose; Lumin Li, Santa Clara, all of Calif.

[73] Assignee: Varian Associates, Inc., Palo Alto, Calif.

[21] Appl. No.: 476,966

[22] Filed: Jun. 7, 1995

[51] Int. Cl.$^6$ ............................................. C23F 1/02
[52] U.S. Cl. .................... 156/345; 216/67; 216/68; 216/71
[58] Field of Search ............... 156/345; 216/67, 216/68, 71; 118/723 E, 723 ER, 723 I, 723 IR, 723 MP; 204/298.06, 298.34, 298.39

[56] References Cited

U.S. PATENT DOCUMENTS

| | | | |
|---|---|---|---|
| 3,562,142 | 2/1971 | Lamont | 204/298.06 |
| 3,654,110 | 4/1972 | Kraus | 204/298.06 |
| 4,297,162 | 10/1981 | Mundt et al. | 156/643 |
| 4,534,816 | 8/1985 | Chen et al. | 156/345 |
| 5,346,578 | 9/1994 | Benzing et al. | 156/345 |
| 5,391,281 | 2/1995 | Hieronymi et al. | 204/298.37 |
| 5,522,343 | 6/1996 | Kodama et al. | 118/723 MP |
| 5,522,934 | 6/1996 | Suzuki et al. | 118/723 AN |

FOREIGN PATENT DOCUMENTS

| | | | |
|---|---|---|---|
| 55-12733 | 1/1980 | Japan | 204/298.34 |

OTHER PUBLICATIONS

R. Thueringer et al, "Optimization of the Discharge Chamber Length of the Rf-Ion Source Rig 10", *6th Intl. Conf. on Gas Discharges and Their Applications*, (Sep. 1980), 130–133.

J. Hopwood, "Review of Inductively Coupled Plasmas for Plasma Processing", *Plasma Source Sci. Technol.*, 1, (1992), 109–116.

A.T. Hui et al. and Chan-Lon Yang et al, "0.5μm Contact/Via Etching With High Density Inductive Plasma", *Jun. 8–9, 1993 VMIC Conference*, (1993), ISMIC—102/93/0496–0498.

Attachment A, Drawing, {described in the "Comment on Art Cited" attached to this Information Disclosure Statement}.

*Primary Examiner*—Jey Tsai
*Assistant Examiner*—Joni Y Chang

[57] ABSTRACT

Electrode designs for reducing the problem of non-uniform etch in large diameter substrates are presented. The electrode opposite the substrate being etched in a plasma reactor can be tailored as to its shape so as to control the uniformity of the etching across the substrate. This is achieved with a number of generally dome-shaped electrode structures including generally cone-shaped electrodes, generally pyramidally-shaped electrodes and generally hemispherically-shaped electrodes. It is believed that non-uniformity of etching is due, at least in part, to excess ion density at the center of the reactor. The dome-shaped electrodes serve to disperse the high concentration of ions from the center of the reactor out toward the periphery of the substrate and thereby even out the ion density distribution across the substrate being etched. The electrodes are useable in diode plasma reactors, triode plasma reactors and ICP plasma reactors.

32 Claims, 14 Drawing Sheets

| TOP PLASMA SHIELD | ETCH RATE (Å/MIN) | UNIFORMITY | MAGNET | ETCH PROFILE |
|---|---|---|---|---|
| I  | 376 | 3.0 (10)<br>4.6 (M/M) | YES |  |
| | 131 | 4.2 (10)<br>8.2 (M/M) | NO |  |
| II  | 347 | 6.4<br>13.8 | YES |  |
| | 145 | 5.9 (10)<br>9.9 (M/M) | NO |  |
| III  | 303 | 5.4<br>19.2 | YES |  |
| | 125 | 3.3 (10)<br>7.2 (M/M) | NO |  |
| IV  | 330 | 5.5<br>11.6 (M/M) | YES |  |
| | 129 | 3.1 (10)<br>6.1 (M/M) | NO |  |

ELECTRODE DESIGNS FOR CONTROLLING UNIFORMITY PROFILES IN PLASMA PROCESSING REACTORS

FIELD OF THE INVENTION

The present invention is directed to an apparatus for use in processing semiconductor devices, flat panel displays, and the like. More particularly, the present invention is directed to a novel electrode configuration for use with various types of capacitively coupled RF powered diode and triode plasma reactors as well as inductively coupled RF powered plasma reactors useable for sputter etching, reactive etching, plasma enhanced chemical vapor deposition, and similar plasma-assisted processes.

BACKGROUND OF THE INVENTION

In processing semiconductor wafers to form integrated circuits thereon, plasma-assisted processes are frequently used both for deposition of materials onto the semiconductor wafer and for etching of materials from the semiconductor wafer. Such processes include plasma etching, reactive ion etching (RIE), plasma enhanced chemical vapor deposition (PECVD), as well as a number of other well known processes. In order to form and power a plasma, an RF (radio frequency) power source is generally used to provide power to one or more powered electrodes within a vacuum vessel containing a gas at a predetermined pressure in which the processing is to take place. A matching network is typically used to efficiently couple power from the RF power source to the powered electrode within vacuum chamber interior. The operation and construction of such matching networks is well known to those of ordinary skill in the art.

The creation of an electric field between electrodes within the vacuum chamber causes electrons present in the gas to initially collide elastically with gas molecules. As this process continues, the electrons gain more energy and eventually begin to collide inelastically with the gas molecules to form excited or ionized species. Eventually a steady state plasma is formed in which excitation and recombination of the atoms with electrons within the plasma are balanced. Highly reactive ions and radical species are produced in the plasma and may be used to etch or deposit materials on semiconductor wafers. Electric and magnetic fields formed within the vacuum chamber either by action of the plasma or by external application of magnetic fields and/or DC or RF self-induced biasing mechanisms are used to control the etching and deposition processes within the vacuum chamber.

Recent trends in the semiconductor industry include requirements for the production of finer and finer device features on larger and larger semiconductor and flat panel display substrates while achieving higher and higher throughput. The goal in the design of semiconductor fabrication equipment is thus to provide equipment capable of rapid processing, low downtime and low levels of contamination and device damage. It is also highly desirable to be able to achieve uniform etching across the relatively large surfaces presented by the 8" and 12" semiconductor substrates currently in production as well as even larger (and rectangular) flat panel display substrates. Often these goals are in conflict with one another.

We will now describe some of the basic reactor designs that the present invention is applicable to. The simplest RF-powered reactor is the single frequency diode reactor. As shown in FIG. 1, a typical prior art diode reactor 10 comprises a powered electrode 12 and a grounded electrode 14 disposed within a vacuum chamber 16. An argon gas supply 18 communicates with the chamber 16 via appropriate control valves and systems (not shown) as well known to those of skill in the art. A vacuum pump 20, generally a cryo-pump or a turbo-molecular pump is used to control the pressure in the chamber 16. An RF power supply 22 supplies RF excitation to powered electrode 12 via RF matching network 24 which is capacitively coupled to powered electrode 12. A wafer 26 is disposed face up on a wafer table (not shown) disposed on powered electrode 12. Shield 28 surrounds wafer 26 on powered electrode 12 and shield 30 surrounds grounded electrode 14.

Turning now to FIG. 2, a dual frequency capacitively coupled triode reactor 32 is shown. It comprises a reactor vacuum chamber 34, a first powered electrode 36 a shield 38, a second powered electrode 40, a shield 42, a first RF power supply 44 ("plasma RF power supply") which drives first powered electrode 36 through an RF matching network 46 and a capacitive coupling to form the plasma. Second powered electrode 40 is biased by means of capacitively coupled second RF power supply 48 ("bias RF power supply" which also employs an RF matching network 50 as well known in the art. Wafer 52 is positioned, preferably by a robotic device (not shown), as shown on second powered electrode 40. The configuration may also be inverted so that gravity assists in keeping particulate contamination off of wafer 52. Different plasma generation configurations may also be used as well known to those of ordinary skill in the art. Chamber 34 is provided with a conventional vacuum pump 54 and an argon gas supply 56. These are controlled with appropriate control systems and valves as known to those of skill in the art. Such dual frequency systems permit control of wafer bias through the RF bias supply independently of the power output of the plasma powering RF supply.

Inductively coupled plasma (ICP) reactors operate by coupling RF from an RF power supply into the plasma, generally by means of a coil, solenoid or similar inductive mechanism. Turning now to FIG. 3, a prior art ICP reactor 58 is shown schematically. Vacuum chamber 60 communicates with a vacuum pump 62 and argon gas supply 64 for controlling the gas environment within chamber 60. An inductive coupling coil 66 is disposed about cylindrical chamber 60 and is powered by plasma RF power source 68 via RF matching network 70. A bias RF power source 72 is capacitively coupled to wafer table (powered electrode) 74 via RF matching network 76. A wafer 78 to be etched is disposed on wafer table 74. An aluminum plate 75 caps the top of cylindrical chamber 60 and serves as a floating or grounded electrode.

The many etching processes performed by reactors such as those described above require a high degree of uniformity across the diameter of the substrate being etched. Unfortunately, parallel plate reactors (such as those shown in FIGS. 1, 2 and 3) built to the size constraints present in semiconductor fabrication facilities tend to etch in a non-uniform manner, generally etching the center of the substrate more than sides. The result can be a concave shape to the wafer which can interfere with subsequent fabrication steps. Accordingly, there is a need for a means for achieving more uniform etching of such substrates.

SUMMARY OF THE INVENTION

The present invention is directed to novel shaped electrodes which, when combined with prior art reactor designs as described above, permit much more uniform etching results from such reactors. It has been discovered by the inventors that the electrode opposite the substrate being etched can be tailored as to its shape so as to control the uniformity of the etching across the substrate. This is achieved with a number of generally dome-shaped electrode structures as set forth in more detail below. These dome-shaped electrode structures may be powered in the case of a triode reactor, floating or grounded, in the case of an ICP reactor, or grounded, in the case of a diode reactor. It is believed that non-uniformity of etching is due, at least in part, to excess ion density at the center of the reactor. Thus, the dome-shaped electrodes serve to displace some of the ions of the plasma from the center of the reactor out toward the periphery of the substrate and thereby even out the ion density distribution across the substrate being etched.

OBJECTS OF THE INVENTION

Accordingly, it is an object of the present invention to provide an etching rector capable of etching large diameter substrates uniformly.

It is a further object of the present invention to provide a dual frequency capacitively coupled triode plasma reactor with a tailored powered electrode coupled to a plasma driving RF source for making the etch rate across the wafer diameter more uniform.

It is a further object of the present invention to provide a single frequency capacitively coupled diode plasma reactor with a tailored grounded electrode for making the etch rate across the wafer diameter more uniform.

It is a further object of the present invention to provide a dual frequency inductively coupled plasma (ICP) plasma reactor with a tailored floating electrode for making the etch rate across the wafer diameter more uniform.

It is a further object of the present invention to provide methods and apparatus for etching large diameter substrates uniformly.

These and many other objects and advantages of the present invention will become apparent to those of ordinary skill in the art from a consideration of the drawings and ensuing description of the invention.

DETAILED DESCRIPTION OF THE INVENTION

Those of ordinary skill in the art will realize that the following description of the present invention is illustrative only and is not intended to be in any way limiting. Other embodiments of the invention will readily suggest themselves to such skilled persons from an examination of the within disclosure.

The present invention is directed to the design of the shape of the electrode (powered, floating or grounded) opposite the substrate being etched in a parallel plate plasma reactor. In effect, the invention is to tailor the shape of one of the parallel plate electrodes so as to control etch uniformity across the substrate being etched. In the prior art, all known plasma reactor electrodes are essentially flat and are not known to effectively control etch uniformity.

Figure 1:
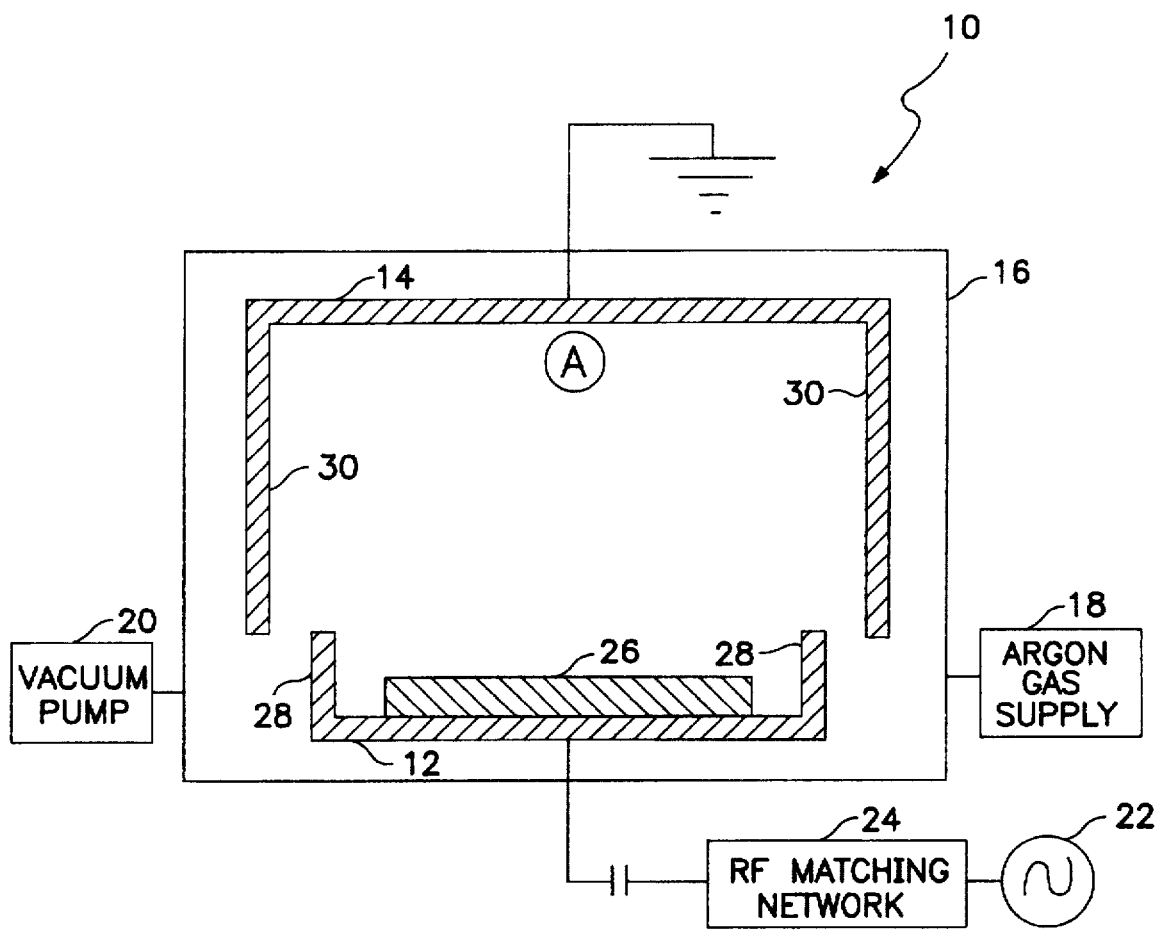
FIG. 1 is a schematic diagram of a diode-type capacitively coupled RF powered plasma reactor used for etching of semiconductor and flat panel display substrates according to the prior art.
Figure 2:
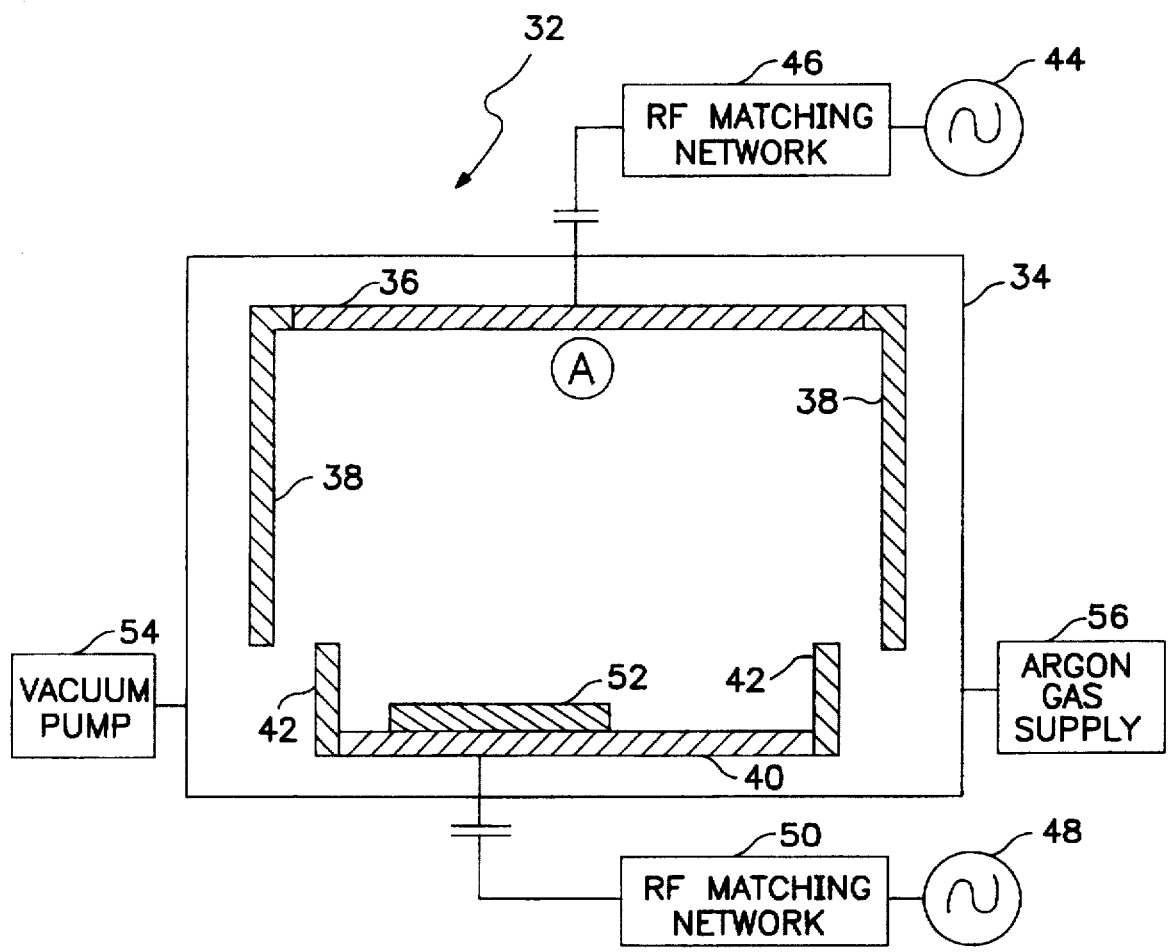
FIG. 2 is a schematic diagram of a triode-type dual frequency capacitively coupled RF powered plasma reactor used for etching of semiconductor and flat panel display substrates according to the prior art.
Figure 3:
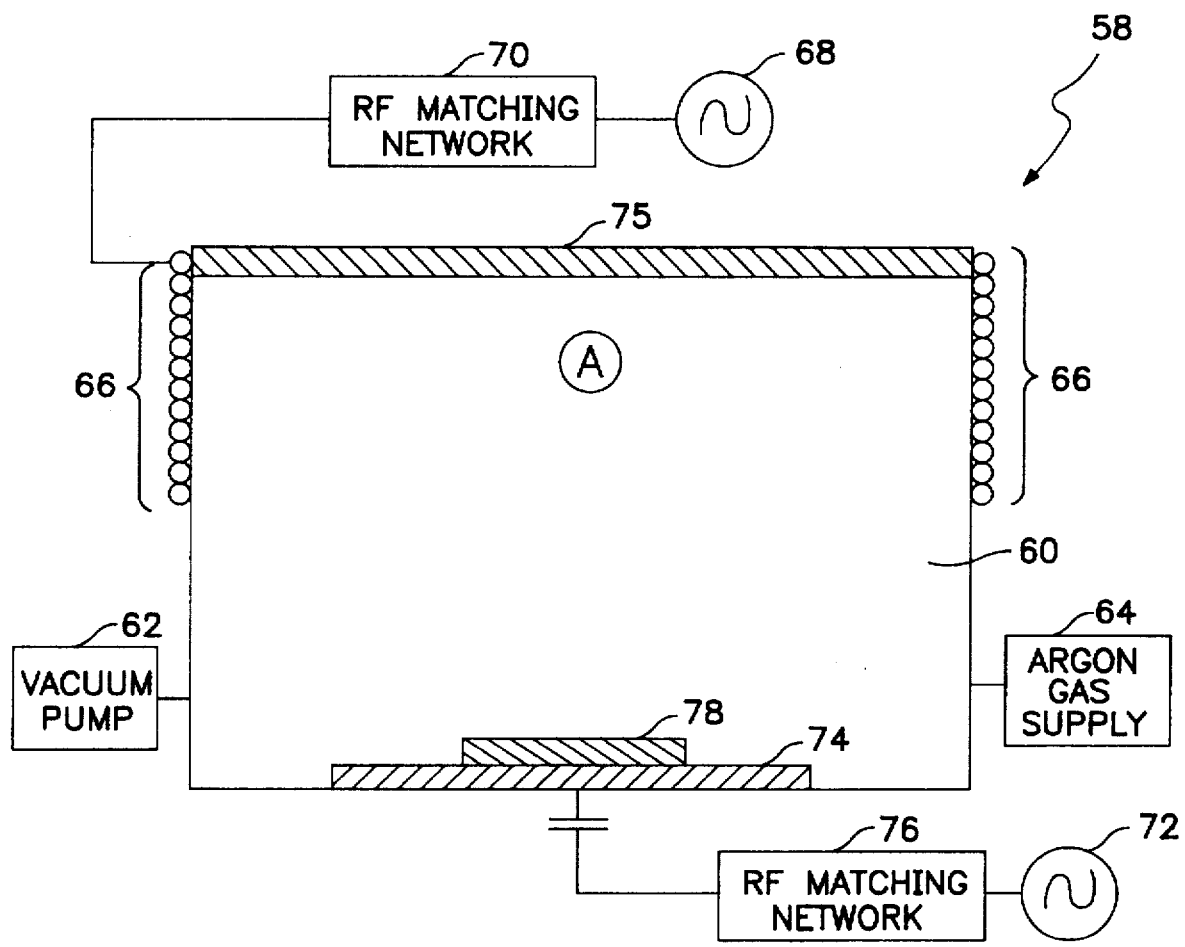
FIG. 3 is a schematic diagram of a dual frequency ICP RF powered plasma reactor used for etching of semiconductor and flat panel display substrates according to the prior art.
Figure 20:
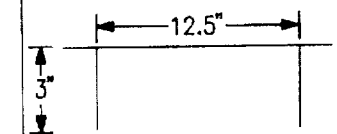
FIG. 20 is a differential etch profiles
Figure 20:
Figure 20:
Figure 20:
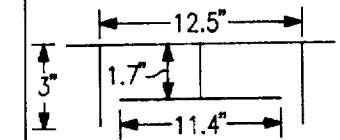
Figure 20:
Figure 20:
Figure 20:
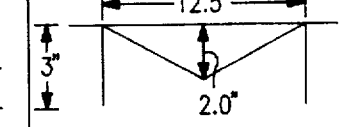
Figure 20:
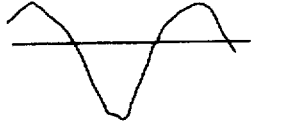
Figure 20:
Figure 20:
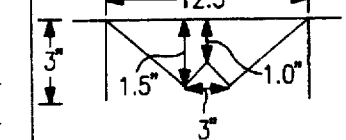
Figure 20:
Figure 20:

The tailored electrodes of the present invention may be installed in the reactors of FIGS. 1, 2 and 3 in the locations labelled "A" which correspond to a grounded electrode in FIG. 1, a powered electrode in FIG. 2 and a floating electrode in FIG. 3. For example, FIG. 20 shows actual data taken from four diode reactor designs. The reactor was a 150 mm wafer diameter diode type with 60 MHz applied to the substrate. Each design was tested first with magnetic enhancement and then without it. The first column shows the electrode/shield configurations I, II, III and IV in elevation. The next column shows the etch rate of $SiO_2$ in an argon plasma in angstroms per minute. Next is a measure of uniformity developed to evaluate uniformity. Lower values indicate more uniformity (i.e., a consistent etch across the wafer). The next column indicates whether magnetic enhancement was used or not. The next column indicates a rough etch profile obtained from the run. Designs I (parallel plate) and II (lowered parallel plate) are prior art designs. Designs III (conic) and IV (conic with reverse conic portion) are made according to the present invention. Each design is essentially axially symmetric about a vertical axis through the center of the electrode.

Figure 4:
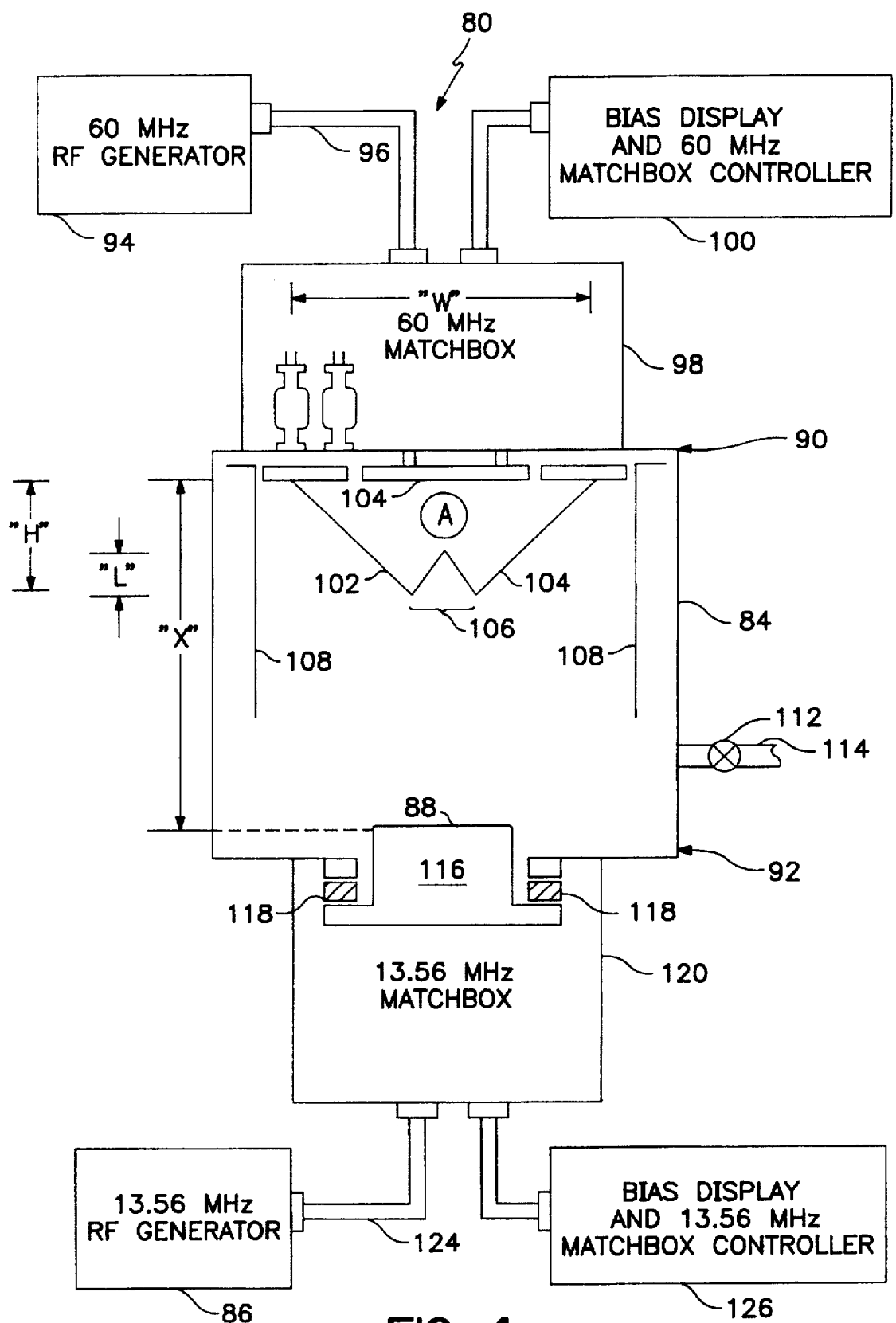
FIG. 4 is a schematic diagram of a dual frequency capacitively coupled triode plasma reactor employing tailored shields according to the present invention.
Figure 5:
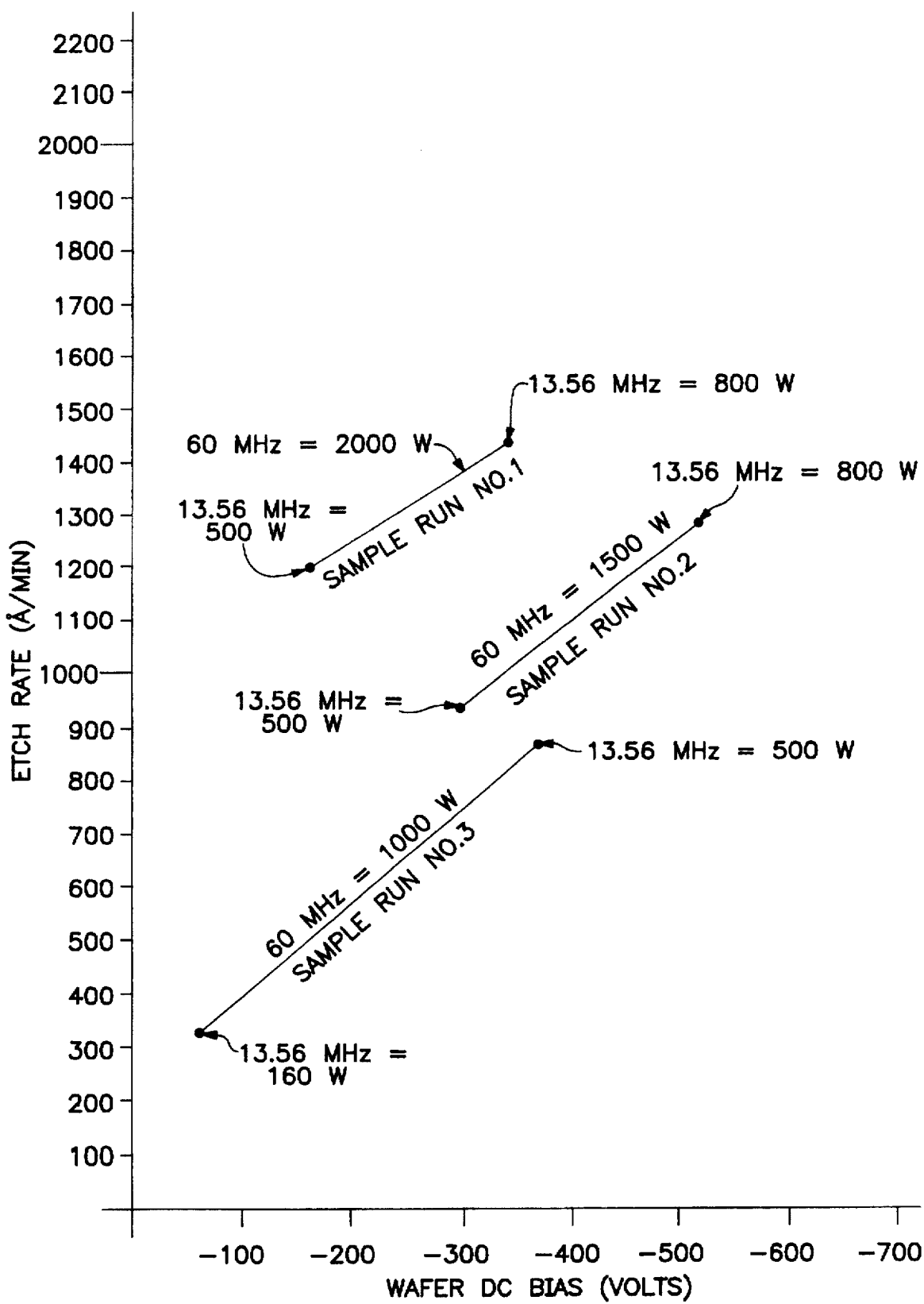
FIG. 5 is a graph of the $SiO_2$ etch rate vs. DC bias for different 60 MHz applied power values at 1.2 mT argon of the dual frequency capacitively coupled triode plasma reactor shown in FIG. 4.

Turning to FIG. 4, a novel dual frequency capacitively coupled triode plasma reactor is depicted. The reactor is the subject of co-pending U.S. patent application Ser. No. 08/480,369 (Docket 95-25), filed on even date herewith, and which is hereby incorporated by reference as if set forth fully herein. A dual frequency triode plasma reactor 80 for processing semiconductor devices and flat panel displays is shown at FIG. 4. A 60 MHz RF power generator 94 is utilized to generate a low potential/high density ($10^{11}$ ions/cc) plasma within vacuum chamber 84. A lower frequency 13.56 MHz RF generator 86 is used to bias the substrate of wafer 88 being processed. The system has been used to sputter etch 200 mm $SiO_2$-coated wafers. The reactor is a parallel plate reactor having an upper electrode 90 ("first powered electrode") and a lower electrode 92 ("second powered electrode"). The 60 MHz RF is applied to the upper electrode 90 and the 13.56 MHz RF is applied to the lower electrode 92. In accordance with the present invention, the shape of upper electrode 90 tailored to achieve uniform etching. Such tailoring permits a more uniform etching across the surface of the wafer. FIG. 5 shows $SiO_2$ etch rate vs. 13.56 MHz self-induced DC bias for different 60 MHz power levels. Sputter etch rates in an argon plasma of more than 500 Å per minute at a low pressure of about 1.2 mT and low bias conditions of less than about 200 VDC have been achieved with this device and indicate the presence of the high density of ions required for most efficient semiconductor processing applications. Visual inspection of the reactor indicates that no etching of the top electrode 90 occurred. This is the result of the low-potential plasma generated at 60 Mhz.

Turning again to FIG. 4, a 60 MHz RF signal from 60 MHz RF generator 94 travels on coaxial cable 96 to 60 MHz Matchbox 98. 60 MHz Matchbox 98 is controlled and monitored in a conventional manner (fixed power output, allowing the bias voltage to float) by Bias Display and 60 MHz Matchbox Controller 100. 60 MHz Matchbox 98 is preferably an automatic matching network under feedback control which matches the impedance of coaxial cable 96 to the impedance presented by upper electrode 90 on a continuous basis. It includes blocking capacitors which achieve capacitive coupling between coaxial cable 96 and upper electrode 90. Matching networks of this type are well known in the art and will not be discussed further herein to avoid over-complicating the disclosure.

Upper electrode 90 may comprise a single flat conductive plate as used in the prior art (not shown), or, more preferably, comprises a tailored electrode designed for uniform etch across the diameter of the wafer. Upper electrode 90 thus comprises an active powered electrode portion 102 and an optional floating electrode portion 104 which is not directly connected to portion 102. Portion 102 is, according to one preferred embodiment of the present invention, a conical conductor over portion 104 and, more preferably, includes a reverse conical conducting portion 106 at its center as shown. It has been found that these arrangements (pure conical (FIG. 6), conical with reverse conical at center (FIG. 7), and conical with flat portion at center (FIG. 8)) yield much more uniform etch rates across the round wafer diameter than do flat plate electrodes under similar conditions.

Figure 9:
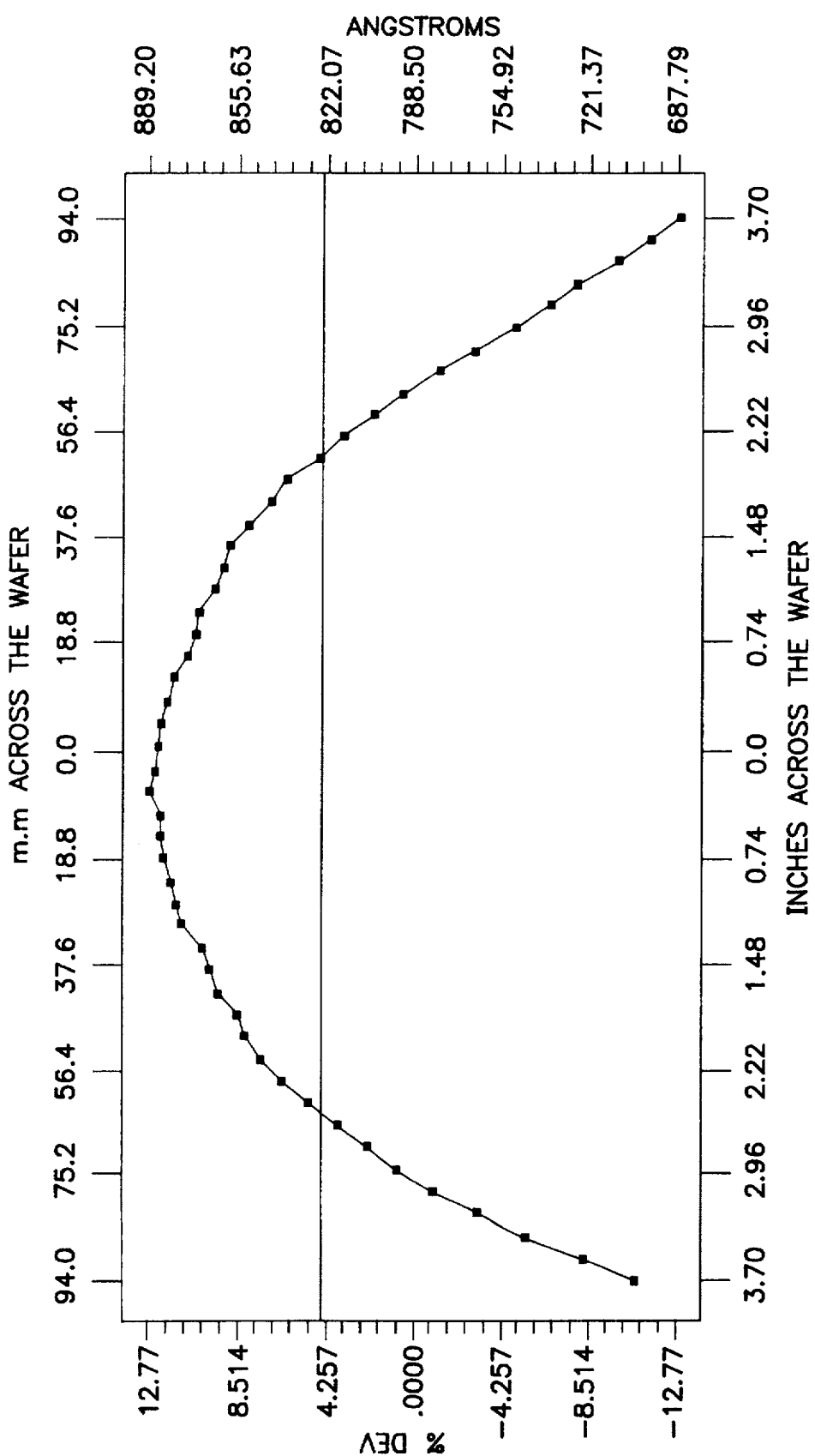
FIG. 9 is a differential etch profile for a parallel plate reactor according to the prior art.
Figure 10:
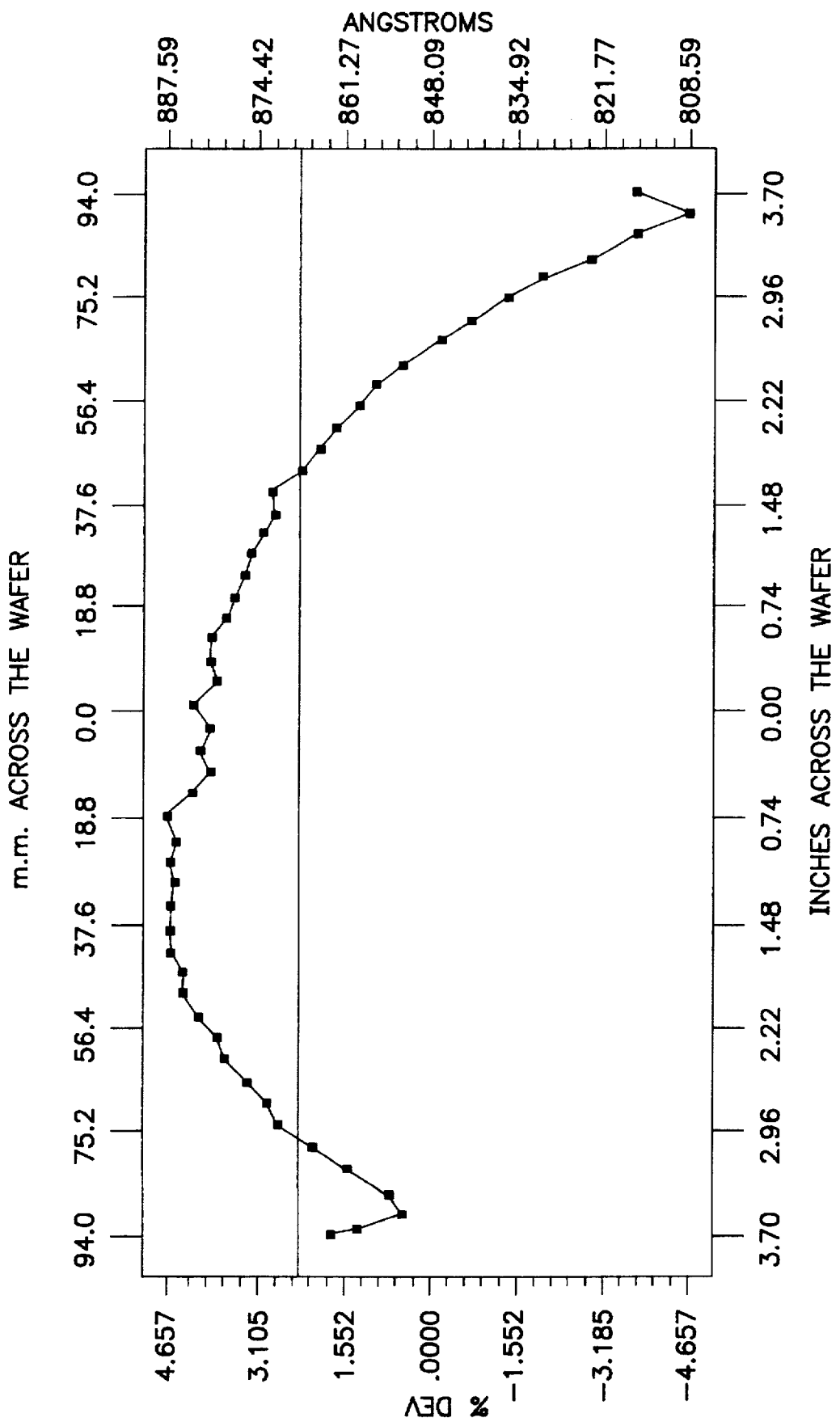
FIGS. 10–11 are differential etch profiles of different configurations of electrodes for controlling uniformity of etch profiles as used according to presently preferred embodiments of the present invention.
Figure 11:
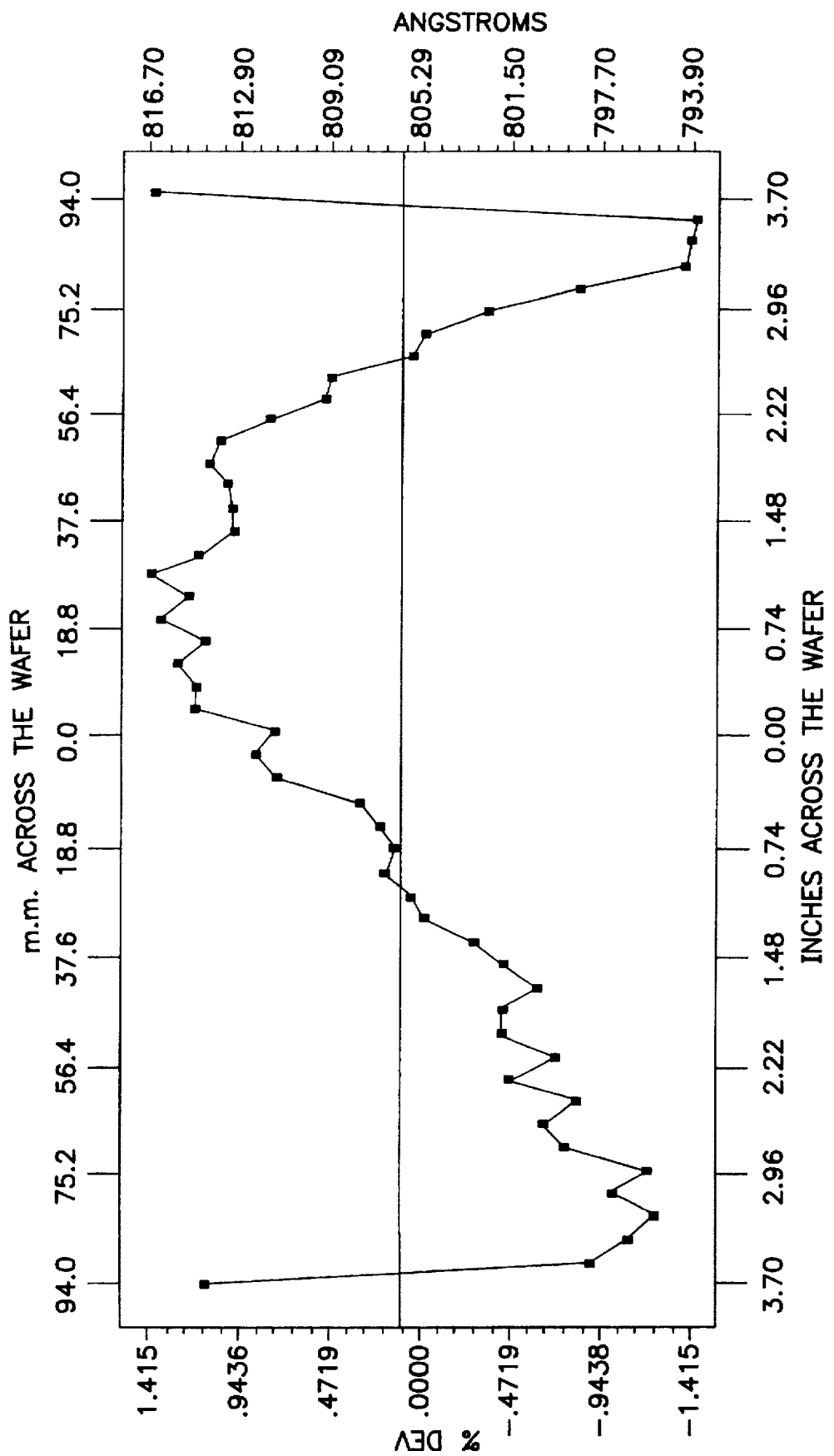

Perfectly uniform etching is an ideal which is difficult to realize in practice, however, a perfectly uniform etch of depth "Z" would leave the etched wafer exactly a distance "Z" thinner at each point. A differential etch profile as used herein refers to a profile produced by the PROMETRIX (tm) SpectraMap (tm) SM200 (tm) as shown in FIGS. 9–11. The differential etch profile looks at the wafer before the etch and after the etch and shows any non-uniformities that occurred. A perfect etch would show a flat line at 0 on the differential etch profile. Some experimental results on the uniform etching feature of the present invention are shown at FIGS. 9, 10 and 11. In each of FIGS. 9–11, the reactor used was substantially as shown in FIG. 4. The differences from FIG. 4 are not considered significant. FIG. 9 shows the differential etch profile of essentially a parallel plate reactor. In this particular case the dimensions for "W" and "X" (marked on FIG. 4) were 10.5" and 5.9", respectively. An etch result like this would generally be considered poor. FIG. 10 shows the differential etch profile of a reactor using the tailored top powered electrode configuration of FIG. 6 (conical). In this particular case, "W" was 10.5", "X" was 4.4", and the height "H" of the cone was 1.7". The etch result is good. FIG. 11 shows the differential etch profile of a reactor using the tailored top powered electrode configuration of FIG. 7 (conical with reversed conical portion). In this particular case, "W" was 10.5", "X" was 4.4", "H" was 1.7" and "L" was 0.9". The etch result is very good. It is believed that the powered electrode designs of FIGS. 6, 7 and 8 serve to reduce the plasma density in the regions where they are closer to the second powered electrode in a manner that is related to the geometric distance between the two powered electrode surfaces, thus the result is that an electrode shape in roughly the opposite shape of the differential etch profile for a parallel plate reactor configuration serves to make much more uniform the etch profile. The conical shapes may thus also be modified slightly, as in rounding them, or the like, without departing from the scope of the present invention.

Figure 12:
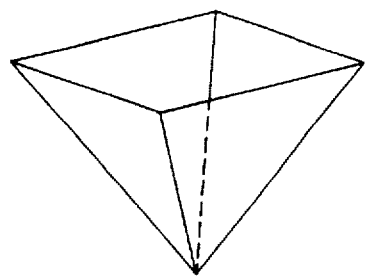
FIG. 12 is a perspective drawing of a tailored electrode according to the present invention having a generally pyramidal shape.
Figure 13:
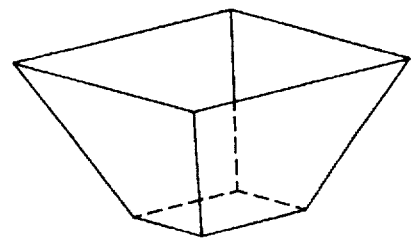
FIG. 13 is a perspective drawing of a tailored electrode according to the present invention having a generally truncated pyramidal shape.
Figure 14:
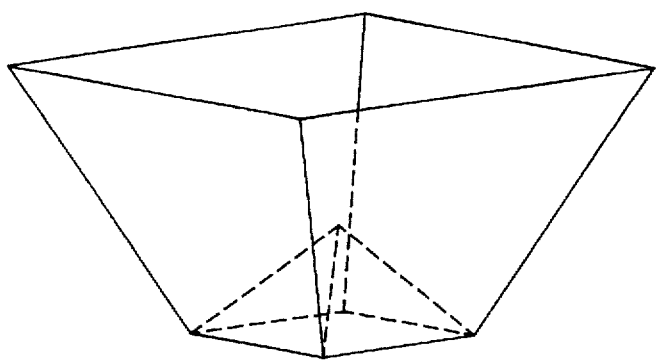
FIG. 14 is a perspective drawing of a tailored electrode according to the present invention having a generally truncated pyramidal shape with a reversed pyramidal portion.

As used in the claims, the narrow portion of a cone is referred to as its apex and the wide part as its base. A conic section is a portion of a cone lacking the portion containing the apex. A folded cone corresponds to the design shown in FIG. 7 consisting of a cone with the apex pointed in the opposite direction as the conic section to which it is attached. A truncated cone is a conic section with a flat part at the narrowest portion as shown in FIG. 8. As used in the claims, the "apex" of a truncated cone is the narrower part of the cone (as opposed to the wider base). The same terminology applies to the pyramid designs of FIGS. 12–14 and the hemispherical designs of FIGS. 15–17. For the hemispherical case, the "apex" is the lowest point in FIG. 15. For the truncated hemispherical case the "apex" is the narrow portion at the truncating plane. This is also the case for the folded hemispherical case where the "apex" is the plane cutting the hemisphere at the joinder of the two reversed hemispheres. The same approach applies to pyramidal shapes. The term "dome shaped" is intended to encompass all of the shaped electrode designs which protrude more into the space between the two electrodes of the reactor at their centers than they do at their edges.

In all cases the upper electrode may be either unperforated, or, more preferably, perforated to permit more etched material to be deposited on the electrode before cleaning is necessary. (See, e.g., co-pending U.S. patent application Ser. No. 08/474,591 (Docket 95-20), filed on even date herewith, and which incorporated by reference as if set forth fully herein.) Turning again to FIG. 4, reactor chamber 84 also includes reactor plasma confinement shield 108 as well known in the art. A valve 112 controls the supply of argon gas (for forming the plasma) from line 114.

Wafer table 116 supports wafer 88 in a conventional manner and is separated from the metallic (and electrically conductive) vacuum chamber 84 by ceramic insulators 118. Below wafer table 116 is the 13.56 MHz Matchbox 120 which operates much the same as 60 MHz Matchbox 98. Again, blocking capacitors are included to aid in achieving a DC bias on the substrate with an applied RF signal.

A 13.56 MHz RF Generator 86 provides an RF signal on transmission line 124 to the 13.56 MHz Matchbox 120 which automatically tunes out any difference in impedance between transmission line 124 and lower electrode 92. A Bias Display and 13.56 MHz Matchbox Controller 126 handles control of the 13.56 MHz Matchbox in a conventional manner.

The generally conical electrodes are most useful with generally round substrates being etched—these include semiconductor wafers such as silicon. For flat panel glass substrates used in flat panel displays which are large and generally rectangular in shape, the conical electrodes can be used as long as they cover the substrate, but more preferred are the pyramidal-shaped and truncated pyramidal-shaped electrodes shown in FIGS. 12, 13 and 14. These work much like the corresponding electrodes set forth in FIGS. 6, 7 and 8 except that they are optimized for use with square or rectangular substrates. In practice, the electrodes of FIGS. 12-14 should preferably have rounded corners and the base of the pyramidal electrode should preferably have an aspect ratio similar to the aspect ratio of the square or rectangular substrate being etched.

Figure 6:
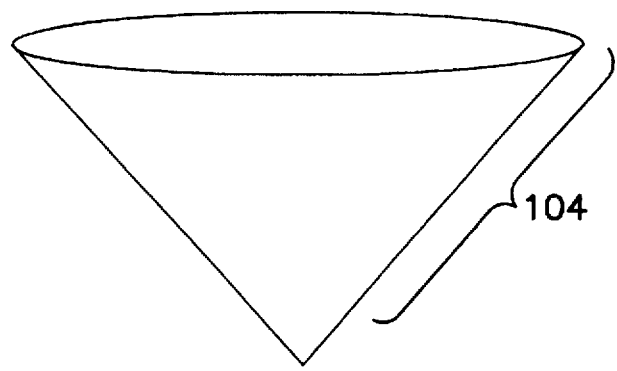
FIG. 6 is a perspective drawing of a tailored electrode according to the present invention having a generally conical shape overall.
Figure 7:
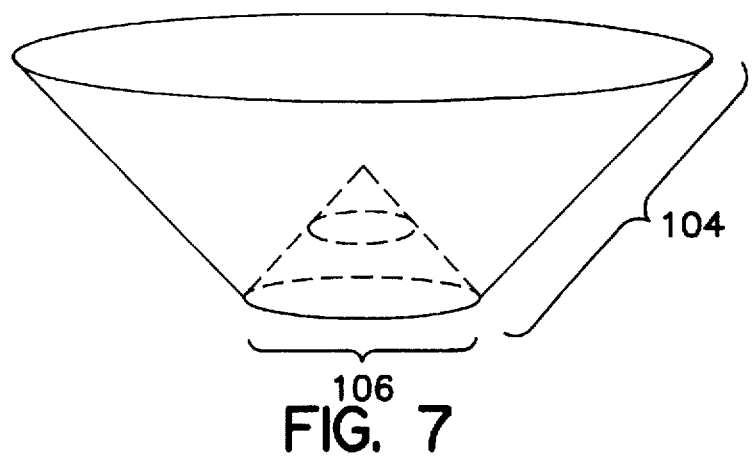
FIG. 7 is a perspective drawing of a tailored electrode according to the present invention having a generally conical shape with a reversed conical portion.
Figure 8:
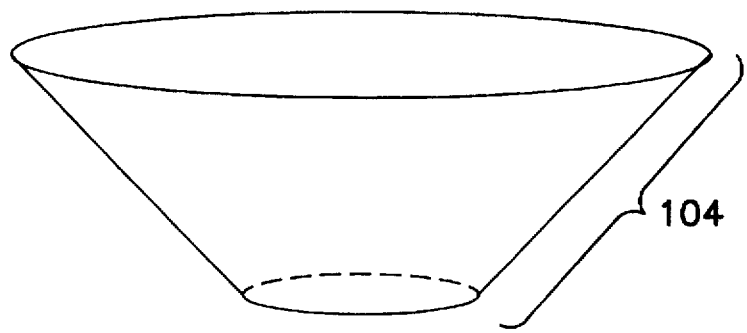
FIG. 8 is a perspective drawing of a tailored electrode according to the present invention having a truncated conical shape overall.
Figure 15:
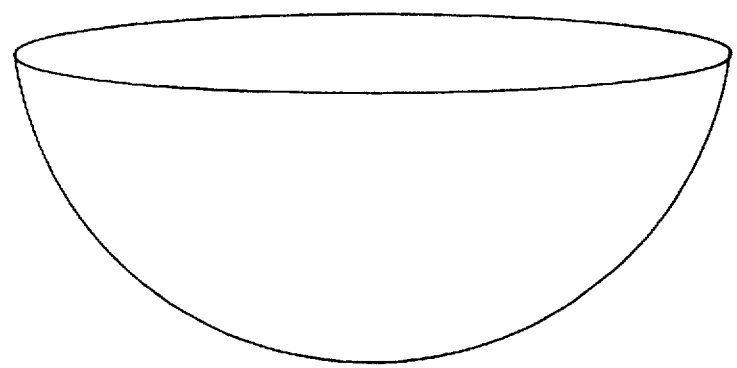
FIG. 15 is a perspective drawing of a tailored electrode according to the present invention having a generally hemispherical shape.
Figure 16:
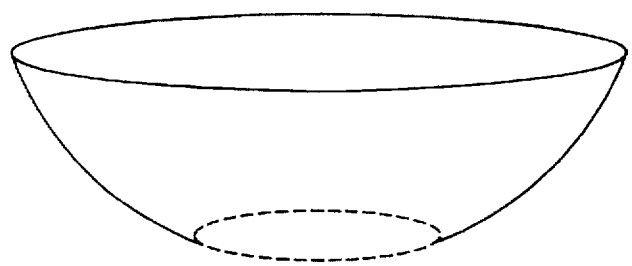
FIG. 16 is a perspective drawing of a tailored electrode according to the present invention having a generally truncated hemispherical shape.
Figure 17:
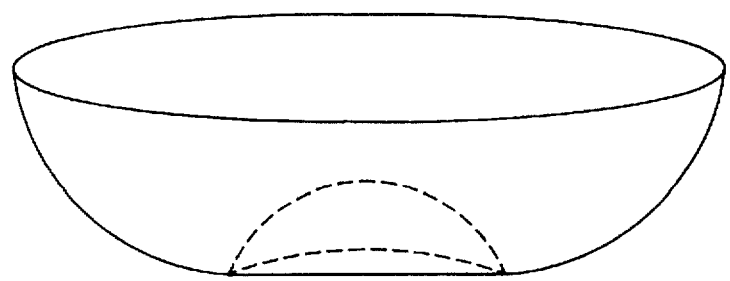
FIG. 17 is a perspective drawing of a tailored electrode according to the present invention having a generally truncated hemispherical shape with a reversed hemispherical portion.

Hemispherically and truncated hemispherically-shaped electrodes are also useable in place of the conical electrodes of FIGS. 6-8. Examples are shown at FIGS. 15, 16 and 17 which correspond to the versions of FIGS. 6, 7 and 8. These shapes are most useful with round substrates.

The electrodes of FIGS. 6, 7, 8, 12, 13, 14, 15, 16 and 17 are useable with the plasma reactors shown in FIGS. 1, 2, 3 and 4. In each case, they should be installed in the position marked "A" adjacent to and contacting: the powered electrode of the FIG. 2 and FIG. 4 reactors; the grounded electrode of the FIG. 1 reactor; and the floating electrode of the FIG. 3 reactor.

Figure 18:
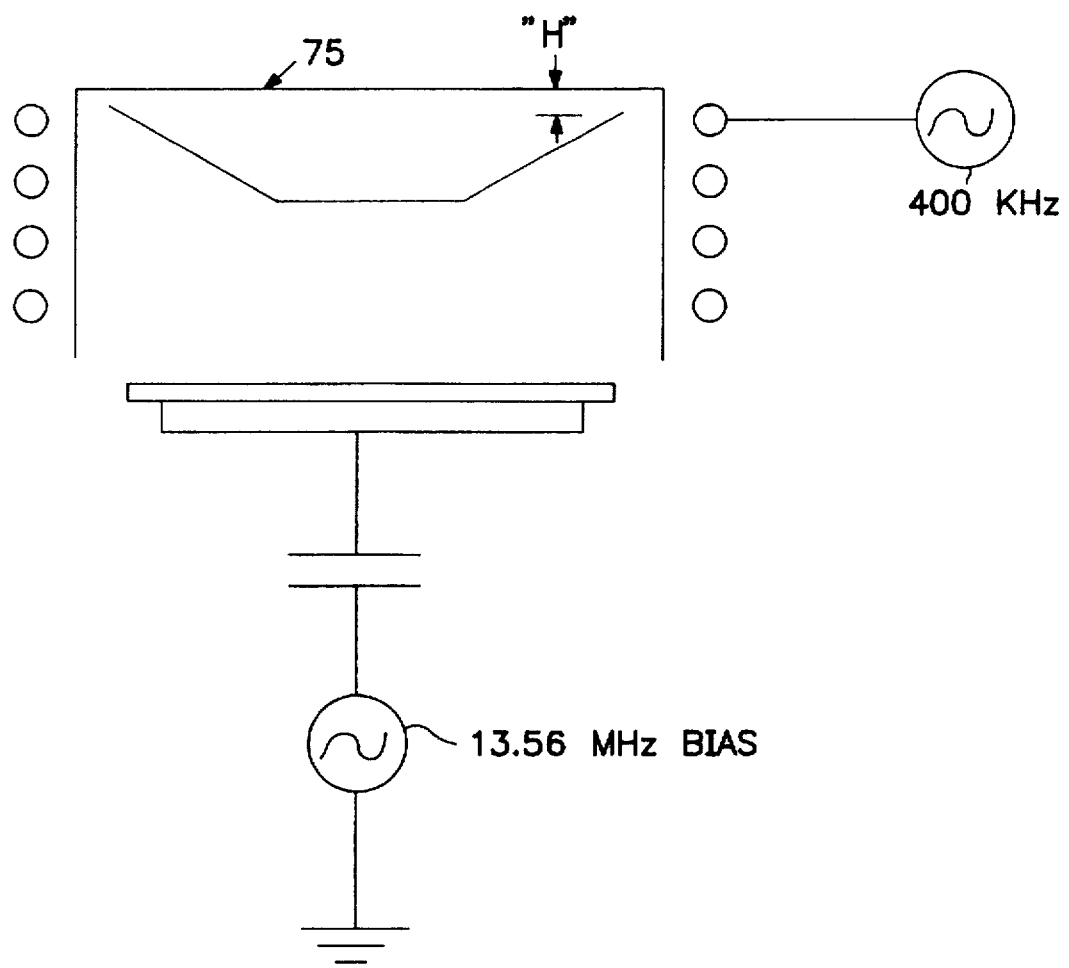
FIG. 18 is a highly schematic view of an ICP reactor similar to that of FIG. 3 according to the present invention.
Figure 19:
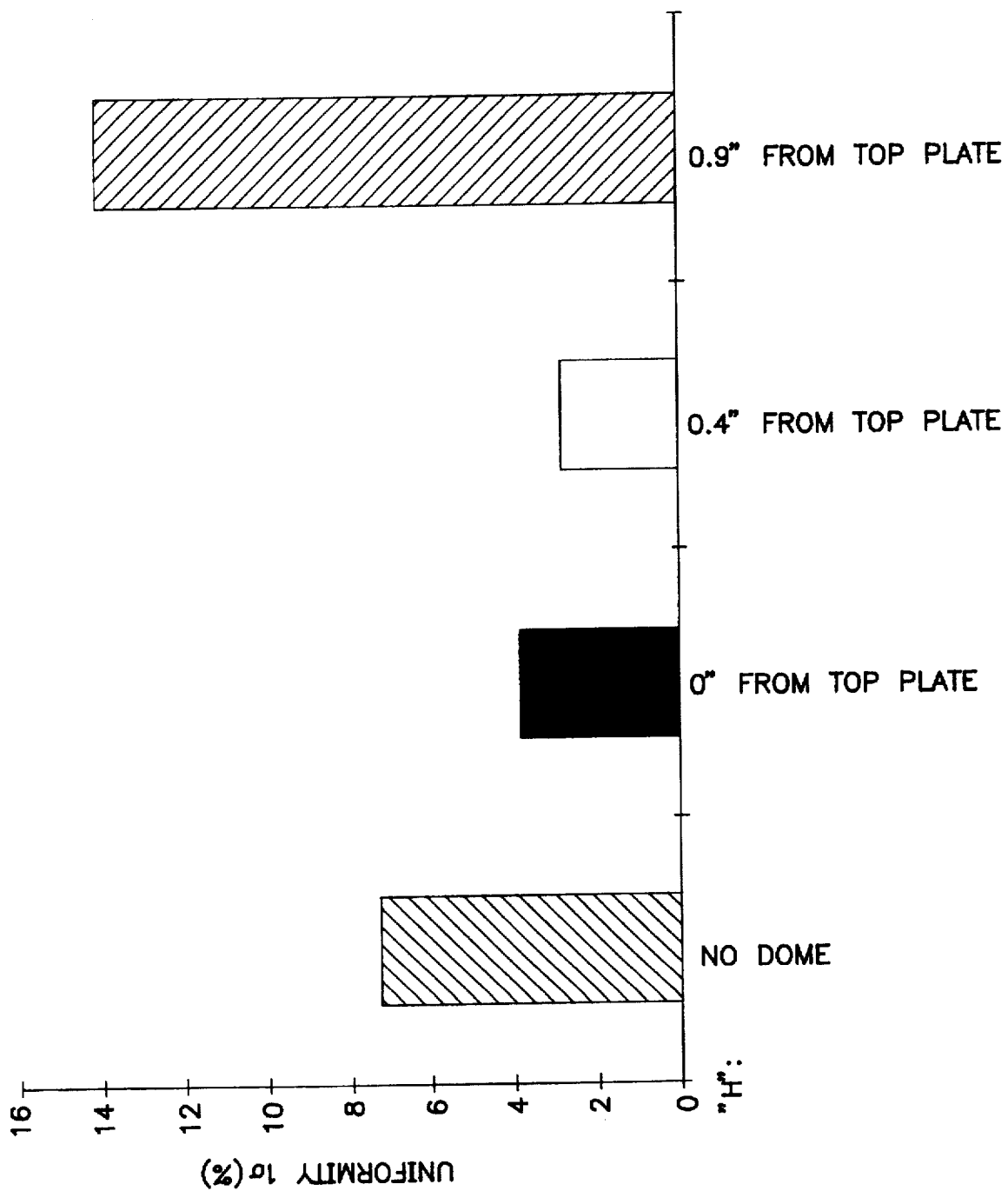
FIG. 19 is a histogram of uniformity (0% means perfectly uniform) versus H for a 500 W plasma power source, 140V DC bias on the wafer at 0.45 mT argon pressure.

FIG. 18 shows a highly schematic view of an ICP reactor similar to that of FIG. 3 according to the present invention. In this case, a truncated conic electrode as shown in FIG. 8 is used as shown and is set a distance "H" from the upper aluminum plate cap 75. Preferably in this configuration the plasma is driven with a 400 KHz RF power source and the wafer bias is achieved with a 13.56 MHz RF bias power supply. FIG. 19 shows the effect of varying "H" in this particular configuration of reactor. FIG. 19 is a histogram of uniformity (0% means perfectly uniform) versus H for a 500 W plasma power source, 140V DC bias on the wafer at 0.45 mT argon pressure. As can be seen, the optimum configuration was about H=0.4 inches. The optimum configuration will vary based upon pressure, power, reactor design, and the like and each set of parameters will need to be optimized for a given reactor design. Such optimizations are routine and easily carried out by those of ordinary skill in the art.

While illustrative embodiments and applications of this invention have been shown and described, it would be apparent to those skilled in the art that many more modifications than have been mentioned above are possible without departing from the inventive concepts set forth herein. Specifically, while some of the electrodes are referred to as the "top" or "upper" electrodes herein, there is nothing to prevent the apparatus from being constructed so that the substrate being etched is held with its processed side facing down rather than up as shown. Clamping devices are known in the art which can achieve this orientation. Furthermore, while some of the claims use the terms "generally conical", "pyramidal", etc., nothing is intended to limit the claims to precisely shaped forms, for example, introducing a curve to the pyramid, or forming a hemispherical shape out of stair steps (as opposed to a smooth curve) should have little effect on the benefits of the invention and such configurations are expressly intended to be covered herein. The invention, therefore, is not to be limited except in the spirit of the appended claims.

What is claimed is:

1. A plasma reactor for etching a substrate, said reactor comprising:
   a first powered electrode adapted to support the substrate, said first powered electrode connected to a source of RF energy;
   a second electrode disposed at a distance from said first powered electrode, said second electrode having a generally conical shape, an apex of said conical shape closer to said first electrode than a base of said conical shape.

2. A reactor according to claim 1 wherein the reactor is a diode type reactor and said second electrode is grounded.

3. A reactor according to claim 1 wherein the reactor is a triode type reactor and said second electrode is a powered electrode connected to a source of RF energy.

4. A reactor according to claim 1 wherein the reactor is an inductively coupled type type reactor and said second electrode is connected to a source of RF energy.

5. A plasma reactor for etching a substrate, said reactor comprising:
   a first powered electrode adapted to support the substrate, said first powered electrode connected to a source of RF energy;
   second electrode disposed at a distance from said first powered electrode, said second electrode having a generally pyramidal shape, an apex of said pyramidal shape closer to said first powered electrode than a base of said pyramidal shape.

6. A reactor according to claim 5 wherein the reactor is a diode type reactor and said second electrode is grounded.

7. A reactor according to claim 5 wherein the reactor is a triode type reactor and said second electrode is a powered electrode connected to a source of RF energy.

8. A reactor according to claim 5 wherein the reactor is an inductively coupled type type reactor and said second electrode is connected to a source of RF energy.

9. A plasma reactor for etching, a substrate, said reactor comprising:
   a first powered electrode adapted to support the substrate, said first powered electrode connected to a source of RF energy;
   a second electrode disposed at a distance from said first powered electrode, said second grounded electrode having a generally truncated conical shape, an apex of said truncated conical shape closer to said first powered electrode than a base of said truncated conical shape.

10. A reactor according to claim 9 wherein the reactor is a diode type reactor and said second electrode is grounded.

11. A reactor according to claim 9 wherein the reactor is a triode type reactor and said second electrode is a powered electrode connected to a source of RF energy.

12. A reactor according to claim 9 wherein the reactor is an inductively coupled type type reactor and said second electrode is connected to a source of RF energy.

13. A plasma reactor for etching a substrate, said reactor comprising:
   a first powered electrode adapted to support the substrate, said first powered electrode connected to a source of RF energy;
   a second electrode disposed at a distance from said first powered electrode, said second electrode having a generally truncated pyramidal shape, an apex of said truncated pyramidal shape closer to said first powered electrode than a base of said truncated pyramidal shape.

14. A reactor according to claim 13 wherein the reactor is a diode type reactor and said second electrode is grounded.

15. A reactor according to claim 13 wherein the reactor is a triode type reactor and said second electrode is a powered electrode connected to a source of RF energy.

16. A reactor according to claim 13 wherein the reactor is an inductively coupled type type reactor and said second electrode is connected to a source of RF energy.

17. A plasma reactor for etching a substrate, said reactor comprising:
   a first powered electrode adapted to support the substrate, said first powered electrode connected to a source of RF energy;
   a second electrode disposed at a distance from said first powered electrode, said second electrode having a generally truncated hemispherical shape, an apex of said truncated hemispherical shape closer to said first electrode than a base of said truncated hemispherical shape.

18. A reactor according to claim 17 wherein the reactor is a diode type reactor and said second electrode is grounded.

19. A reactor according to claim 17 wherein the reactor is a triode type reactor and said second electrode is a powered electrode connected to a source of RF energy.

20. A reactor according to claim 17 wherein the reactor is an inductively coupled type type reactor and said second electrode is connected to a source of RF energy.

21. A plasma reactor for etching a substrate, said reactor comprising:
   a first powered electrode adapted to support the substrate, said first powered electrode connected to a source of RF energy;
   a second electrode disposed at a distance from said first powered electrode, said second electrode having a generally folded conical shape, an apex of said folded conical shape closer to said first electrode than a base of said folded conical shape.

22. A reactor according to claim 21 wherein the reactor is a diode type reactor and said second electrode is grounded.

23. A reactor according to claim 21 wherein the reactor is a triode type reactor and said second electrode is a powered electrode connected to a source of RF energy.

24. A reactor according to claim 21 wherein the reactor is an inductively coupled type type reactor and said second electrode is connected to a source of RF energy.

25. A plasma reactor for etching a substrate, said reactor comprising:
   a first powered electrode adapted to support the substrate, said first powered electrode connected to a source of RF energy;
   a second electrode disposed at a distance from said first powered electrode, said second electrode having a generally folded pyramidal shape, an apex of said folded pyramidal shape closer to said first electrode than a base of said folded pyramidal shape.

26. A reactor according to claim 25 wherein the reactor is a diode type reactor and said second electrode is grounded.

27. A reactor according to claim 25 wherein the reactor is a triode type reactor and said second electrode is a powered electrode connected to a source of RF energy.

28. A reactor according to claim 25 wherein the reactor is an inductively coupled type type reactor and said second electrode is connected to a source of RF energy.

29. A plasma reactor for etching a substrate, said reactor comprising:
   a first powered electrode adapted to support the substrate, said first powered electrode connected to a source of RF energy;
   a second electrode disposed at a distance from said first powered electrode, said second electrode having a generally folded hemispherical shape, an apex of said folded hemispherical shape closer to said first electrode than a base of said folded hemispherical shape.

30. A reactor according to claim 29 wherein the reactor is a diode type reactor and said second electrode is grounded.

31. A reactor according to claim 29 wherein the reactor is a triode type reactor and said second electrode is a powered electrode connected to a source of RF energy.

32. A reactor according to claim 29 wherein the reactor is an inductively coupled type type reactor and said second electrode is connected to a source of RF energy.

* * * * *